United States Patent

Fukuda et al.

Patent Number: 5,616,176
Date of Patent: Apr. 1, 1997

[54] OXIDE GARNET SINGLE CRYSTAL

[75] Inventors: Satoru Fukuda; Masayuki Tanno; Toshihiko Ryuo, all of Gunma-ken, Japan

[73] Assignee: Shin-Etsu Chemical Co., Ltd., Tokyo, Japan

[21] Appl. No.: 495,934

[22] Filed: Jun. 28, 1995

[30] Foreign Application Priority Data

Jul. 1, 1994 [JP] Japan ................................. 6-151111

[51] Int. Cl.$^6$ ......................................... C30B 29/28
[52] U.S. Cl. ........................ 117/54; 117/60; 117/945
[58] Field of Search ..................... 117/54, 60, 945

[56] References Cited

U.S. PATENT DOCUMENTS

| | | | |
|---|---|---|---|
| 4,563,236 | 1/1986 | Ross et al. | 423/594 |
| 4,698,820 | 10/1987 | Brandle et al. | 252/62.57 |
| 4,810,325 | 3/1989 | Licht | 117/945 |

FOREIGN PATENT DOCUMENTS

| | | |
|---|---|---|
| 0510621 | 10/1992 | European Pat. Off. . |
| 03-69597 | 3/1991 | Japan ................. 117/945 |

OTHER PUBLICATIONS

Patent Abstracts of Japan vol. 14, No. 269 (P-1059) Jun. 11, 1990 & JP A-02 077 719 Mar. 16, 1990 Mitsubishi Gas Chem Co., Inc.

Patent Abstracts of Japan, vol. 15, No. 202 (C-834) May 23, 1991 & JP A-03 054198 (Shin-Etsu Chemical Co., Ltd.).

Patent Abstracts of Japan, vol. 15, No. 34 (C-799) Jan. 28, 1991 & JP A-02 271 997 (Shin-Etsu Chemical Co., Ltd.) Nov. 6, 1990.

*Primary Examiner*—Robert Kunemund
*Attorney, Agent, or Firm*—McAulay Fisher Nissen Goldberg & Kiel, LLP

[57] ABSTRACT

A novel rare earth-based oxide garnet single crystal suitable as a material of the elements in a magneto-optical device to exhibit a greatly decreased light absorption loss is proposed, which is prepared by the liquid epitaxial growth method on a oxide garnet single crystal wafer and having a chemical composition represented by the general formula $$Gd_aHo_bEu_dBi_{3-a-b-d}Fe_{5-c}M_cO_{12},$$

in which M is an element or a combination of elements selected from the group consisting of aluminum, scandium, gallium and indium, the subscript a is a positive number in the range from 1.1 to 2.1, the subscript b is a positive number in the range from 0.1 to 0.9, the subscript c is 0 or a positive number not exceeding 0.5 and the subscript d is zero or a positive number not exceeding 0.6 or, in particular, in the range from 0.03 to 0.6 with the proviso that 3−a−b−d is in the range from 0.7 to 1.2.

3 Claims, No Drawings

OXIDE GARNET SINGLE CRYSTAL

BACKGROUND OF THE INVENTION

The present invention relates to a novel oxide garnet single crystal or, more particularly, to a rare earth-based oxide garnet single crystal having improved light absorption characteristics in the 1.55 μm wavelength band and outstandingly small saturation magnetization and useful as a functional element in various magneto-optical devices such as optical isolators, optical switches and the like, which enables a more compact design of the devices.

Single crystals of a bismuth-substituted rare earth-iron oxide garnet are well known materials to serve as a functional element in various kinds of magneto-optical devices such as optical isolators, optical switches and the like and they are conventionally prepared by the method of epitaxial growth on the substrate of a certain single crystalline material. As a consequence of the epitaxial growing method, it is almost unavoidable that the rare earth-based oxide garnet single crystals as grown are contaminated with various kinds of contaminants including, for example, lead ions originating from the lead oxide used as a constituent of the flux of the melt and platinum ions originating from the material of the crucible used in the liquid epitaxial growing method. These contaminants are of course very detrimental against the performance of the single crystals as a functional element of magneto-optical devices. When the oxide garnet single crystal is used as an element in an optical isolator, for example, the absorption of light in the working wavelengths of 0.8 μm, 1.3 μm and 1.55 μm is more or less increased by these contaminants resulting in an increased insertion loss.

In consideration of these problems, a proposal has been made to introduce a very trace amount of divalent or tetravalent metallic ions such as $Ca^{2+}$, $Mg^{2+}$, $Ti^{4+}$ and the like into the oxide garnet single crystals of this type (see, for example, The 11th Japan Applied Magnetics Society, Preprints for Scientific Lectures, November 1987, 2C-10, page 137). This method has another problem that, while the rare earth-based oxide garnet single crystals as epitaxially grown are required to have a thickness of at least 50 μm, introduction of the above mentioned metallic ions thereinto causes variation in the chemical composition of the oxide garnet layer during the epitaxial growing to destroy the uniformity in the performance of the single crystal-based devices.

Alternatively, Japanese Patent Publication No. 5-13916 teaches that the above mentioned problem can be solved with an epitaxially grown oxide garnet single crystal having a chemical composition expressed by the formula

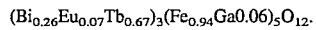

$(Bi_{0.26}Eu_{0.07}Tb_{0.67})_3(Fe_{0.94}Ga0.06)_5O_{12}$.

Although this oxide garnet single crystal has good magneto-optical characteristics in the 1.3 μm wavelength band, the light absorption loss in the 1.55 μm wavelength band is increased due to the influence of the light absorption by the terbium ions in the longer wavelength region so that, for example, magneto-optical devices such as optical isolators prepared by using such a single crystal suffer from an increased insertion loss when they are to be used in the 1.55 μm wavelength band.

Further alternatively, Japanese Patent Kokai No. 2-77719 proposes a magneto-optical oxide garnet single crystal suitable for temperature compensation, which has a chemical composition expressed by the general formula $Ho_{3-x-y}Gd_x$-$Bi_yFe_{5-z}Ga_zO_{12}$, in which x is a positive number of 0.8 to 1.2, y is a positive number of 0.7 to 1.2 and z is a positive number of 1.2 to 1.7. As a consequence of the substitution of the so large amount of gallium as a non-magnetic element for iron as the magnetic element, the Faraday rotation coefficient thereof is so small as to be about 590 degrees/cm for the light of a wavelength of 1.55 μm as is shown in the Examples so that such an epitaxially grown garnet film cannot be used alone in a Faraday rotation device such as optical isolators unless the film thickness of the garnet film is unduly large. Needless to say, such a garnet film having a sufficiently large thickness can be obtained only by a substantial extension of the time taken for the epitaxial growth of the garnet film naturally with a disadvantage in the production costs.

Still alternatively, Japanese Patent Kokai No. 3-280012 proposes a magneto-optical material which is a magnetic oxide garnet single crystal film having a chemical composition expressed by the formula $Ho_{3-u-v}Gd_uBi_vFe_5O_{12}$, in which u and v are each zero or a positive number smaller than 3 with the proviso that u+v does not exceed 3. A problem in the garnet single crystals of this type is that, when the content of gadolinium is so small as in the garnet of the formula $Ho_{1.45}Gd_{0.25}Bi_{1.30}Fe_5O_{12}$ shown in the Examples, the magnetic saturation thereof is as large as about 1000 G so that a magneto-optical device such as optical isolators prepared with such a garnet single crystal can work only by using an unduly large magnet generating a magnetic field strong enough.

SUMMARY OF THE INVENTION

The present invention accordingly has an object to provide a novel and improved epitaxially grown single crystal of a rare earth-based oxide garnet free from the above described problems and disadvantages in the conventional oxide garnet single crystals of the similar types.

Thus, the invention provides an epitaxially grown single crystal of a rare earth-based oxide garnet having a chemical composition represented by the general formula

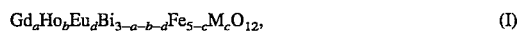

$$Gd_aHo_bEu_dBi_{3-a-b-d}Fe_{5-c}M_cO_{12}, \quad (I)$$

in which M is an element or a combination of elements selected from the group consisting of aluminum, scandium, gallium and indium, the subscript a is a positive number in the range from 1.1 to 2.1 or, preferably, from 1.2 to 1.6, the subscript b is a positive number in the range from 0.1 to 0.9 or, preferably, from 0.6 to 0.9, the subscript c is 0 or a positive number not exceeding 0.5 and the subscript d is zero or a positive number not exceeding 0.6 with the proviso that 3−a−b−d is in the range from 0.7 to 1.2 or, preferably, from 0.7 to 1.1.

The value of the subscript d, which defines the content of europium, can be zero in the garnet composition but introduction of a substantial amount of europium, for example, corresponding to the value d of at least 0.03 has an effect of greatly decreasing the light absorption.

DETAILED DESCRIPTION OF THE PREFERRED EMBODIMENTS

As is understood from the above given description, the oxide garnet single crystal of the invention has a chemical composition represented by the general formula (I) given above, which is, when the subscript d is zero, analogous to the formula disclosed in Japanese Patent Kokai No. 2-77719 excepting for the omission or decrease of the amount of gallium which partially substitute for the iron although the atomic ratio of gadolinium, holmium and bismuth overlaps with that taught in the prior art.

In particular, it has been unexpectedly discovered that incorporation of europium in an amount corresponding to the value of the subscript d of 0.03 to 0.6 is advantageous in respect of the decrease in the light absorption.

The above defined rare earth-based oxide garnet single crystal is obtained by the method of liquid epitaxial growth on a single crystal substrate. Namely, the epitaxial growth of the oxide garnet single crystal proceeds on a substrate surface from a melt of an oxide mixture consisting of oxides of the respective elements containing flux materials such as lead oxide and boron oxide.

The above mentioned substrate is a single crystal plate of a rare earth-based garnet such as the samarium-gallium garnet, referred to as SGG hereinafter, neodymium-gallium garnet, referred to as NGG hereinafter, gadolinium-gallium garnet, referred to as GGG hereinafter, and the like, optionally, doped with a limited amount of a dopant such as calcium, magnesium, zirconium, yttrium and the like sold under the tradenames of SOG, NOG and others by Shin-Etsu Chemical Co., Ltd., Japan. These rare earth-based garnet single crystals can be prepared by the so-called Czochralski method in which a single crystal boule is pulled up from a melt of the oxide mixture consisting of gallium oxide and gadolinium oxide, samarium oxide or neodymium oxide, if necessary, with admixture of a small amount of the dopant oxide such as calcium oxide, magnesium oxide, zirconium oxide and the like as grown on the bottom end of a single crystal seed.

The rare earth-based oxide garnet single crystal of the invention to be grown on the surface of the above described garnet single crystal as the substrate usually in the form of a flat plate or disc has a chemical composition represented by the formula (I) given before in which each symbol has the meaning as defined there. It is important that the value of the subscript a in the formula is at least 1.1 because, when the value of a is too small, the saturation magnetization of the oxide garnet single crystal cannot be lower than 700 G which is a desirable upper limit of the saturation magnetization in order that an magneto-optical device such as optical isolators and the like can be constructed with a sufficiently compact magnet.

Thus, an oxide melt is formed from the respective oxides including gadolinium oxide $Gd_2O_3$, holmium oxide $Ho_2O_3$, bismuth oxide $Bi_2O_3$, iron oxide $Fe_2O_3$ and, if the subscript d is not zero, europium oxide $Eu_2O_3$ together with flux materials including lead oxide PbO and boron oxide $B_2O_3$ by heating the mixture at a temperature of 1100° to 1200° C. with the substrate plate immersed therein followed by keeping the melt in a supercooled state at a temperature of 750° to 950° C. so that epitaxial growth of the oxide garnet single crystal proceeds on the surface of the substrate plate to form a layer of the single crystal.

In the above described method of liquid epitaxial growth of the inventive rare earth-based oxide garnet single crystal on the substrate surface, it is important that the epitaxially grown single crystal layer has a relatively large thickness still without any cracks or other defects that the difference between the lattice constant of the epitaxially grown oxide garnet single crystal and that of the garnet single crystal as the substrate, which is 1.2508 nm in the NGG and 1.2496 nm in the NOG, is as small as possible or, desirably, not larger by ±0.0003 nm. This requirement can be satisfied by appropriately selecting the values of the subscripts a, b, c and d in the composition formula (I). With the prerequisite that the value of the subscript a must be 1.1 or larger as is mentioned above, for example, the value of b should not exceed 0.9 since otherwise the lattice constant of the epitaxially grown single crystal is too small. The balance between the values of a and b is also important because, if the content of bismuth in the single crystal is too low, the single crystal would suffer from a decrease in the Faraday rotation coefficient. This problem is solved by selecting the value of the subscript a not exceeding 2.1 and the value of b not smaller than 0.1. These limitations in the values of a and the subscript b also satisfactory in order not to unduly increase the lattice constant of the single crystal.

When the above mentioned requirements are satisfied so as to almost completely eliminate the mismatching in the lattice constant between the substrate single crystal and the epitaxially grown single crystal, the epitaxially grown oxide garnet single crystal of the invention is free from any defects such as cracks and pits on the surface. The principal constituents including gadolinium, holmium and europium, each being a rare earth element, naturally have good compatibility with other rare earth ions not to cause any problems relative to the uniformity of the oxide garnet single crystal. The combination of gadolinium and holmium is particularly advantageous in order to effect an improvement in respect of the light absorption at a wavelength of 1.55 μm. The saturation magnetization can be small enough when appropriate selection is made for the content of gadolinium. In addition, introduction of europium has an effect to further improve the light absorption. Having these characteristics, the rare earth-based oxide garnet single crystal of the invention can be used advantageously as a material of various kinds of magneto-optical devices such as optical isolators and the like of high performance with compact dimensions.

In the following, the rare earth-based oxide garnet single crystal of the invention is described in more detail by way of examples and comparative examples.

EXAMPLE 1

The substrate plate used for the epitaxial growth of the inventive oxide garnet single crystal was a single crystal wafer of NOG having a thickness of 0.500 mm and a diameter of 25 mm with a lattice constant of 1.2496 nm. Into a platinum crucible were introduced 8.610 g of gadolinium oxide, 5.983 g of holmium oxide, 932.04 g of bismuth oxide, 120.55 g of iron oxide, 892.9 g of lead oxide and 39.90 g of boron oxide and they were mixed together and heated at 1100° C. to form a melt in which the substrate wafer was immersed. The temperature of the melt was gradually decreased and kept in the range from 784.5° to 789.5° C. for about 53 hours so as to effect epitaxial growth of the oxide garnet single crystal layer on both of the substrate surfaces.

The thus epitaxially formed layer of the oxide garnet single crystal having a thickness of 0.591 mm was analyzed for the chemical composition by the ICP (induction-coupled plasma) emission spectrophotometry to find that the chemical composition thereof could be expressed by the formula $$Gd_{1.26}Ho_{0.76}Bi_{0.98}Fe_5O_{12}.$$

The epitaxially grown single crystal layers of the oxide garnet on the substrate surfaces were freed from the substrate wafer by mechanical working and polished on the surface followed by cutting into pieces of the epitaxially grown oxide garnet single crystal each having dimensions of 2.9 mm by 2.9 mm by 0.512 mm which were subjected to the measurement of the magneto-optical properties at a wavelength of 1.55 μm to find quite satisfactory values of the parameters including −44.8 degrees of the Faraday rotation angle, 0.056 degree/°C. of the temperature dependency coefficient thereof, −875 degrees/cm of the Faraday rotation coefficient, 0.05 dB of the loss by light absorption and 660 G of the saturation magnetization.

EXAMPLE 2

The same NOG wafer as in Example 1 was used as the substrate plate and the epitaxial growth of an oxide garnet single crystal layer thereon was performed at a temperature in the range from 783.5° to 788.5° C. for 47 hours in a melt of an oxide mixture consisting of 8.318 g of gadolinium oxide, 5.780 g of holmium oxide, 931.82 g of bismuth oxide, 116.47 g of iron oxide, 5.011 g of gallium oxide, 892.7 g of lead oxide and 39.89 g of boron oxide melted by heating at 1100° C. in a platinum crucible.

The thus formed layer of the oxide garnet single crystal having a thickness of 0.636 mm was analyzed for the chemical composition by the ICP emission spectrophotometry to find that the chemical composition thereof could be expressed by the formula $$Gd_{1.18}Ho_{0.71}Bi_{1.11}Fe_{4.73}Ga_{0.27}O_{12}.$$

The epitaxially grown single crystal layers of the oxide garnet were freed from the substrate wafer by mechanical working and polished on the surface followed by cutting into pieces of the epitaxially grown oxide garnet single crystal each having dimensions of 2.9 mm by 2.9 mm by 0.559 mm which were subjected to the measurement of the magneto-optical properties at a wavelength of 1.55 μm to find quite satisfactory values of the parameters including −44.8 degrees of the Faraday rotation angle, 0.059 degree/°C. of the temperature dependency coefficient thereof, −801 degrees/cm of the Faraday rotation coefficient, 0.05 dB of the loss by light absorption and 430 G of the saturation magnetization.

Comparative Example 1

The same NOG wafer as in Example 1 was used as the substrate plate and the epitaxial growth of an oxide garnet single crystal layer thereon was performed at a temperature in the range from 749.5° to 752.5° C. for 63 hours in a melt of an oxide mixture consisting of 1.489 g of europium oxide, 13.929 g of terbium oxide, 977.38 g of bismuth oxide, 123.86 g of iron oxide, 5.273 g of gallium oxide, 936.36 g of lead oxide and 41.72 g of boron oxide melted by heating at 1100° C. in a platinum crucible..

The thus formed layers of the oxide garnet single crystal having a thickness of 0.695 mm were analyzed for the chemical composition by the ICP emission spectrophotometry to find that the chemical composition thereof could be expressed by the formula $$Eu_{0.21}Tb_{1.97}Bi_{0.82}Fe_{4.71}Ga_{0.29}O_{12}.$$

The wafer-borne epitaxially grown single crystal layers of the oxide garnet were freed from the substrate wafer by mechanical working and polished on the surface followed by cutting into pieces of the epitaxially grown oxide garnet single crystal each having dimensions of 2.9 mm by 2.9 mm by 0.559 mm which were subjected to the measurement of the magneto-optical properties at a wavelength of 1.55 μm to find quite satisfactory values of the parameters including −44.7 degrees of the Faraday rotation angle, 0.051 degree/°C. of the temperature dependency coefficient thereof, −736 degrees/cm of the Faraday rotation coefficient and 350 G of the saturation magnetization but the loss by light absorption was as large as 0.12 dB.

EXAMPLE 3

The substrate plate used for the epitaxial growth of the inventive oxide garnet single crystal was a single crystal wafer of NOG having a thickness of 0.500 mm and a diameter of 25 mm with a lattice constant of 1.2496 nm. Into a platinum crucible were introduced 7.732 g of gadolinium oxide, 5.373 g of holmium oxide, 1.421 g of europium oxide, 932.07 g of bismuth oxide, 120.55 g of iron oxide, 892.94 g of lead oxide and 39.90 g of boron oxide and they were mixed together and heated at 1100° C. to form a melt in which the substrate wafer was immersed. The temperature of the melt was gradually decreased and kept in the range from 786.0° to 791.0° C. for about 66 hours so as to effect epitaxial growth of the oxide garnet single crystal layer on both of the substrate surfaces.

The thus epitaxially formed layer of the oxide garnet single crystal having a thickness of 0.725 mm was analyzed for the chemical composition by the ICP (induction-coupled plasma) emission spectrophotometry to find that the chemical composition thereof could be expressed by the formula $$Gd_{1.21}Ho_{0.82}Eu_{0.20}Bi_{0.77}Fe_5O_{12}.$$

The epitaxially grown single crystal layers of the oxide garnet on the substrate surfaces were freed from the substrate wafer by mechanical working and polished on the surface followed by cutting into pieces of the epitaxially grown oxide garnet single crystal each having dimensions of 2.9 mm by 2.9 mm by 0.669 mm which were subjected to the measurement of the magneto-optical properties at a wavelength of 1.55 μm to find quite satisfactory values of the parameters including −45.0 degrees of the Faraday rotation angle, 0.056 degree/°C. of the temperature dependency coefficient thereof, −673 degrees/cm of the Faraday rotation coefficient, 0.02 dB of the loss by light absorption and 670 G of the saturation magnetization.

Comparative Example 2

The same NOG wafer as in Example 1 was used as the substrate plate and the epitaxial growth of an oxide garnet single crystal layer thereon was performed at a temperature in the range from 757.5° to 762.5° C. for 38 hours in a melt of an oxide mixture consisting of 5.740 g of gadolinium oxide, 8.974 g of holmium oxide, 931.98 g of bismuth oxide, 120.54 g of iron oxide, 892.86 g of lead oxide and 39.90 g of boron oxide melted by heating at 1100° C. in a platinum crucible ..

The thus formed layers of the oxide garnet single crystal having a thickness of 0.696 mm were analyzed for the chemical composition by the ICP emission spectrophotometry to find that the chemical composition thereof could be expressed by the formula $$Gd_{0.95}Ho_{1.03}Bi_{1.02}Fe_5O_{12}.$$

The wafer-borne epitaxially grown single crystal layers of the oxide garnet were freed from the substrate wafer by mechanical working and polished on the surface followed by cutting into pieces of the epitaxially grown oxide garnet single crystal each having dimensions of 2.9 mm by 2.9 mm by 0.498 mm which were subjected to the measurement of the magneto-optical properties at a wavelength of 1.55 μm to find quite satisfactory values of the parameters including −44.8 degrees of the Faraday rotation angle, 0.067 degree/°C. of the temperature dependency coefficient thereof, −904 degrees/cm of the Faraday rotation coefficient and as large as 820 G of the saturation magnetization not to ensure use of a compact magnet in a magneto-optical device such as optical isolators although the loss by light absorption was as large as 0.06 dB.

What is claimed is:

1. A single crystal of a rare earth-based oxide garnet having a chemical composition represented by the general formula $$Gd_aHo_bEu_dBi_{3-a-b-d}Fe_{5-c}M_cO_{12},$$

in which M is an element or a combination of elements selected from the group consisting of aluminum, scandium, gallium and indium, the subscript a is a positive number in the range from 1.1 to 2.1, the subscript b is a positive number in the range from 0.1 to 0.9, the subscript c is 0 or a positive number not exceeding 0.5 and the subscript d is zero or a positive number not exceeding 0.6 with the proviso that 3−a−b−d is in the range from 0.7 to 1.2.

2. The single crystal of a rare earth-based oxide garnet as claimed in claim 1 in which the value of the subscript d is in the range from 0.03 to 0.6.

3. The single crystal of a rare earth-based oxide garnet as claimed in claim 2 in which the values of the subscripts a and b are in the ranges from 1.2 to 1.6. and from 0.6 to 0.9 with the proviso that 3−a−b−d is in the range from 0.7 to 1.1.

* * * * *